(12) United States Patent
Kang et al.

(10) Patent No.: US 8,587,499 B2
(45) Date of Patent: Nov. 19, 2013

(54) ORGANIC LIGHT EMITTING DIODE DISPLAY

(75) Inventors: Jin-Goo Kang, Yongin (KR); Sang-Moo Choi, Yongin (KR); Mu-Hyun Kim, Yongin (KR); Keum-Nam Kim, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 792 days.

(21) Appl. No.: 12/805,200

(22) Filed: Jul. 19, 2010

(65) Prior Publication Data

US 2011/0012816 A1    Jan. 20, 2011

(30) Foreign Application Priority Data

Jul. 20, 2009    (KR) .................. 10-2009-0066044

(51) Int. Cl.
   *G09G 3/30*    (2006.01)
(52) U.S. Cl.
   USPC .............................................. 345/76; 345/92
(58) Field of Classification Search
   USPC ................... 345/76–80, 87–96, 204–215; 315/169.1–169.3
   See application file for complete search history.

(56) References Cited

U.S. PATENT DOCUMENTS

| 6,072,450 | A | 6/2000 | Yamada et al. |
| 6,888,587 | B2 | 5/2005 | Deane |
| 7,184,006 | B2 * | 2/2007 | Kim .................................. 345/76 |
| 7,692,191 | B2 | 4/2010 | Kwak et al. |
| 2006/0170634 | A1 * | 8/2006 | Kwak et al. ..................... 345/92 |
| 2007/0216280 | A1 | 9/2007 | Hara et al. |

FOREIGN PATENT DOCUMENTS

| JP | 10-161564 A | 6/1998 |
| JP | 2002-170686 A | 6/2002 |
| JP | 2003-091246 A | 3/2003 |
| JP | 2003-264082 A | 9/2003 |
| JP | 2008-112112 A | 5/2008 |
| JP | 2008-159935 A | 7/2008 |
| JP | 2009-086024 A | 4/2009 |
| KR | 10 2003-0057018 A | 7/2003 |
| KR | 10-2006-0087885 A | 8/2006 |
| KR | 10-2006-0122742 A | 11/2006 |

* cited by examiner

*Primary Examiner* — Vijay Shankar
(74) *Attorney, Agent, or Firm* — Lee & Morse, P.C.

(57) ABSTRACT

An organic light emitting diode display including a plurality of pixel areas and a transparent area interposed between the plurality of pixel areas, the display includes a substrate member, thin film transistors and capacitor elements on the substrate member, the thin film transistor and the capacitor elements overlapping with the pixel areas, a gate line, a data line, and a common power supply line on the substrate member, the gate line, the data line, and the common power supply line overlapping with the pixel areas and the transparent area, and being connected to corresponding ones of the thin film transistors and/or the capacitor elements, and pixel electrodes on the substrate member, the pixel electrodes overlapping with all of the thin film transistors and capacitor elements, and with respective portions of the gate line, the data line, and the common power supply line that overlap with the pixel areas.

20 Claims, 3 Drawing Sheets

ORGANIC LIGHT EMITTING DIODE DISPLAY

BACKGROUND

1. Field

Embodiments generally relate to an organic light emitting diode (OLED) display, and more particularly, to a transparent organic light emitting diode display.

2. Description of the Related Art

An organic light emitting diode display includes a plurality of organic light emitting diodes, each diode having a hole injection electrode, an organic emission layer, and an electron injection electrode. Holes supplied from the hole injection electrode, e.g., anode, and electrons supplied from the electron injection electrode, e.g., cathode, may be recombined as an exciton, i.e., an electron-hole pair, in the organic emission layer. The organic emission layer may emit light when the exciton returns to a base energy state, e.g., exciton drops from an excited state to a ground state. Organic light emitting diode displays may display an image using this light emission.

Based on such principle, the organic light emitting diode display has a self-luminous characteristic, and because the organic light emitting diode display does not need a light source, unlike a liquid crystal display, it can have a relatively small thickness and weight. Further, organic light emitting diode displays generally have a variety of beneficial properties such as low power consumption, high luminance, quick response time, etc. Therefore, the organic light emitting diode displays may be used as an alternative display for portable electronic devices.

In addition, in view of its characteristics, organic light emitting diode displays may be made as a transparent display device that enable a user to see an object or image located on an opposite side with the object or image being projected through the organic light emitting diode display. That is, the organic light emitting diode display can be manufactured such that, when it is in an off state, an object or image located at the opposite side may be projected, and when the organic light emitting diode display is in an on state, an image emitted from the organic light emitting diode display can be seen.

However, when the organic light emitting diode display is in the off state, the object or image located at the opposite side may be projected through a space between patterns, such as a thin film transistor and various wiring, as well as through the organic light emitting diode display, before being transferred to the user. Typically, a gap between the patterns is about several hundreds of nm, and has the same level as the wavelength of light in a visible region, thus causing scattering of transmitted light. Thus, the image transferred to the user may be a distorted image.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to organic light emitting diode display; which substantially overcomes one or more of the problems due to the limitations and disadvantages of the related art.

It is therefore a feature of an embodiment to provide an organic light emitting diode display that prevents distortion by suppressing scattering of transmitted light.

It is therefore a separate feature of an embodiment to provide a transparent organic light emitting diode display that prevents distortion by suppressing scattering of transmitted light.

At least one of the above and other features and advantages may be realized by providing an organic light emitting diode display including a transparent area and a plurality of pixel areas, the pixel areas being spaced apart from each other and the transparent area being interposed between the pixel areas, the display including a substrate member, thin film transistors and capacitor elements on the substrate member, the thin film transistor and the capacitor elements overlapping with the pixel areas, a gate line, a data line, and a common power supply line on the substrate member, the gate line, the data line, and the common power supply line overlapping with the pixel areas and the transparent area, and being connected to corresponding ones of the thin film transistors and/or the capacitor elements, and pixel electrodes on the substrate member, the pixel electrodes overlapping with all of the thin film transistors and capacitor elements, and with respective portions of the gate line, the data line, and the common power supply line that overlap with the pixel areas.

The pixel area may be substantially and/or completely the same as a region covered by the pixel electrode.

An area ratio of the transparent area to a total area of the pixel areas and the transparent area may be equal to or within the range of about 20% to about 90%.

The area ratio of the transparent area to the total area of the pixel areas and the transparent area may be within a range of 20% to 90%.

The pixel electrode may include a reflective conducting material.

The display may further include an organic emission layer and a common electrode that are sequentially formed on the pixel electrode, wherein the organic emission layer may be adapted to emit light in a direction of the common electrode to display an image.

The gate line, the data line, and the common power supply line on neighboring ones of the pixels areas may be interconnected over the transparent area.

The display may include an insulating layer, a planarization layer, and a pixel definition layer on the substrate member, wherein the planarization layer and the pixel definition layer include a transparent material.

A transmittance of the substrate member may be higher than and/or equal to a total transmittance of layers formed on the substrate member.

At least one of the above and other features and advantages may also be separately realized by providing an organic light emitting diode display including a transparent area and a plurality of pixel areas, the pixel areas being spaced apart from each other and the transparent area being interposed between the pixel areas, the display including a substrate member, pixel electrodes on the substrate member, the pixel electrodes corresponding to the pixel areas of the display, thin film transistors and capacitor elements completely arranged on the pixel electrodes, and a gate line, a data line, and a common power supply connected to corresponding ones of the thin film transistors and/or the capacitor elements, each of the gate line, the data line, and the common power supply line including pixel portions directly overlapping with corresponding ones of the pixel electrodes and interconnecting portions extending between neighboring ones of the pixel electrodes so as to connect neighboring ones of the pixel portions of the gate line, the data line, and the common power supply line, respectively, wherein only the interconnecting portions of the gate line, the data line, and the common power supply line are arranged on the transparent area of the display.

The substrate member may include glass, quartz, ceramic and/or plastic.

The substrate member may have a transmittance that is higher than or equal to a total transmittance of all layers and/or elements arranged thereon, the layers and/or elements including a buffer layer, an insulating layer, an interlayer insulation layer, and a planarization layer arranged on the substrate member.

Other than the interconnecting portions of the gate line, the data line, and the common power supply line, only transparent layers and/or elements may be arranged on portions of the substrate member overlapping with the transparent area of the display.

The display may further include a buffer layer on the substrate member, a gate insulating layer on the buffer layer, a planarization layer on the gate insulating layer, and a pixel definition layer on the gate insulating layer, wherein the buffer layer, the gate insulating layer, the planarization layer and the pixel definition layer may include only transparent materials.

The pixel definition layer may be arranged on portions of the substrate member corresponding to the transparent area of the display.

The pixel electrodes may be arranged in a matrix pattern including rows extending along a first direction and columns extending along a second direction, the first direction crossing the second direction.

The gate line may extend along the first direction and the interconnecting portions of the gate line extend between facing sides of neighboring ones of the pixel electrodes arranged in one of the rows.

The data line and the common power supply line may extend along the second direction and the interconnecting portions of the of the data line and the common power supply line extend between facing sides of neighboring ones of the pixel electrodes arranged in one of the columns.

The pixel areas of the display may correspond to areas of the pixel electrodes.

Within a display area of the display, the transparent area may correspond to an area of the display region other than the pixel areas.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
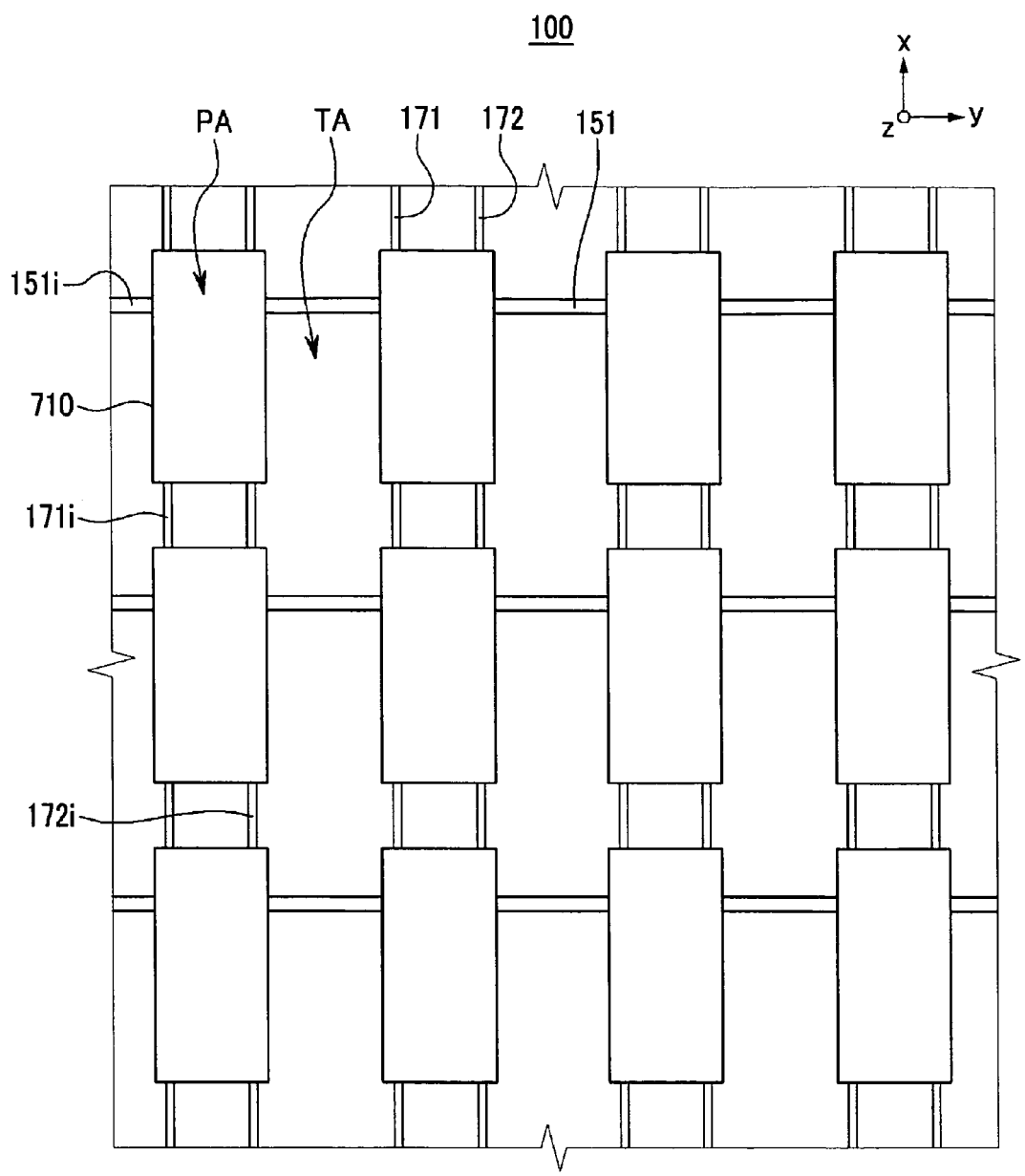
FIG. 1 illustrates a layout view of an exemplary embodiment of an organic light emitting diode display.

Korean Patent Application No. 10-2009-0066044, filed on Jul. 20, 2009, in the Korean Intellectual Property Office, and entitled: "Organic Light Emitting Diode Display," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Further, the sizes and thicknesses of the elements shown in the drawings are arbitrarily shown for convenience of description, and thus embodiments are not limited to those illustrated.

In the drawings, thicknesses are magnified in order to clearly depict the plurality of layers and regions. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Throughout the specification, known or aspects that are not necessary for understanding of the exemplary embodiments are omitted.

In addition, in the accompanying drawings, although an active matrix (AM) type of organic light emitting diode display having a 2TR-1Cap structure, which includes two transistors, e.g., thin film transistors, and one capacitor for one pixel, is illustrated, embodiments are not limited thereto. Accordingly, e.g., the organic light emitting diode display may include three or more thin film transistors and two or more capacitor elements in one pixel. The organic light emitting display may have various structures with additional wiring.

Here, a pixel area refers to an area where a pixel may be formed. A pixel refers to a minimum unit for displaying an image. The organic light emitting diode display may display an image through a plurality of pixels. More particularly, the organic light emitting diode display may include a display area and a peripheral area, and may display an image in the display area of the display through a plurality of pixels.

Figure 2:
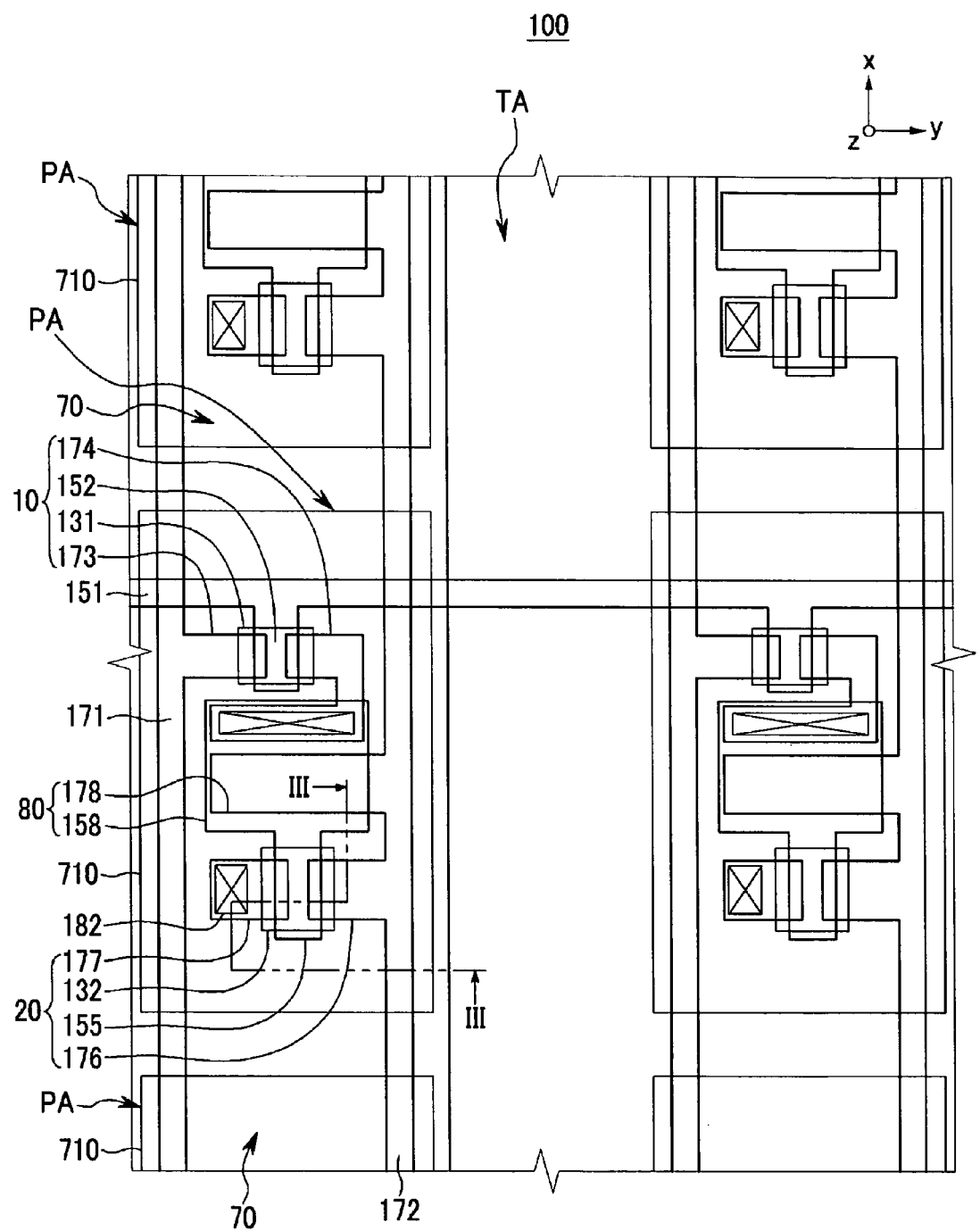
FIG. 2 illustrates an enlarged layout view of a portion of FIG. 1.
Figure 3:
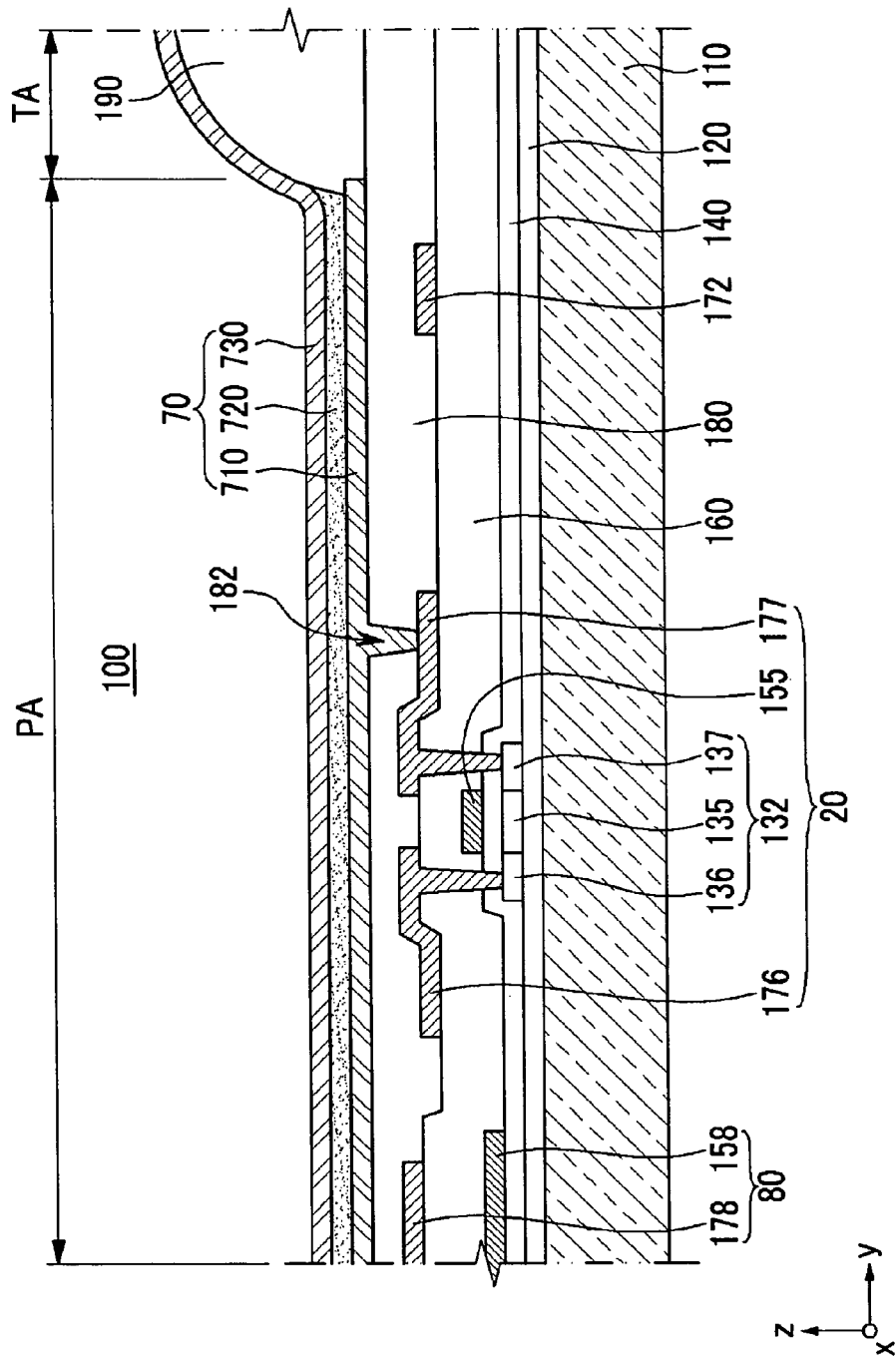
FIG. 3 illustrates a cross-sectional view of the exemplary organic light emitting diode display of FIG. 1, taken along line III-III of FIG. 2.

Hereinafter, an exemplary embodiment will be described with reference to FIGS. 1 to 3. FIG. 1 illustrates a layout view of an exemplary embodiment of an organic light emitting diode display 100. FIG. 2 illustrates an enlarged layout view of a portion of the exemplary light emitting diode display 100 of FIG. 1. FIG. 3 illustrates a cross-sectional view of the exemplary organic light emitting diode display 100 of FIG. 1, taken along line of FIG. 2.

As shown in FIG. 1, the organic light emitting diode display 100 may include a transparent area TA and a plurality of pixel areas PA. The pixel areas PA may be spaced apart from each other. The transparent areas TA may be interposed between the pixel areas PA. The pixel areas PA and the transparent area TA may be formed such that an area ratio of the transparent area TA to the total area of the pixel areas PA and the transparent area TA may be equal to and/or within the range of about 20% to about 90%. Further, in some embodiments, e.g., the display 100 may include a display area and, e.g., a peripheral area (not shown), and the display area may only include the pixel areas PA and the transparent area TA.

As shown in FIG. 2, each pixel area PA of the organic light emitting diode display 100 may include a switching thin film transistor 10, a driving thin film transistor 20, a capacitor element 80, and an organic light emitting diode (OLED) 70.

The organic light emitting diode display 100 may further include a gate line 151, a data line 171, and a common power supply line 172. The gate line 151 may extend along a first direction, e.g., y-direction, on the pixel areas PA and the transparent area TA. The data line 171 may be insulated from the gate line 151, and may extend on the pixel areas PA and the transparent area TA along a second direction, e.g., x-direction, that crosses the gate line 151. The x-direction may be perpendicular to the y-direction. The common power supply line 172 may be insulated from the gate line 151, and may extend along the second direction, e.g., x-direction, on the pixel areas PA and the transparent area TA. The gate line 151, the data line 171, and/or the common power supply line 172 may be formed so as to overlap the pixel areas PA as much as possible. The gate line 151, the data line 171, and/or the common power supply line 172 may be formed in a pattern such that respective portions of the gate line 151, the data line 171, and/or the common power supply line 172 on neighboring ones of the pixel areas PA may be interconnected. In some embodiments, referring to FIG. 1, e.g., only interconnecting portions 151i, 171i, 172i of the gate line 151, the data line 171, and the common power supply line 172 may overlap with the transparent area TA. The gate line 151, the data line 171, and the common power line 172 may be formed so as to overlap the transparent area TA as little as possible, i.e., to have a smallest possible area overlapping the transparent area TA.

Referring to FIG. 3, the organic light emitting element 70 may include a pixel electrode 710, an organic emission layer 720, and a common electrode 730. The organic emission layer 720 may be formed on the pixel electrode 710. The common electrode 730 may be formed on the organic emission layer 720. The pixel electrode 710 may be an anode (+) electrode, e.g., a hole injection electrode. The common electrode 730 may be a cathode (−), electrode, e.g., an electron injection electrode. Embodiments are not limited thereto. For example, in some embodiments, the pixel electrode 710 may be a cathode electrode and the common electrode 730 may be a cathode electrode according to a driving method of the organic light emitting diode display 100. Holes and electrons may be respectively injected from the pixel electrode 710 and the common electrode 730 into the organic emission layer 720. Excitons may be formed when the injected holes and the injected electrons combine. When the excitons fall from an excited state to a ground state, the organic emission layer 720 may emit light.

Referring to FIG. 2, the pixel electrode 710 may overlap the entire pixel area PA, i.e., the region covered by the pixel electrode 710 may be substantially and/or exactly the same as the pixel area PA. In such embodiments, the pixel electrode 710 may overlap all portions of the switching thin film transistor 10, the driving thin film transistor 20, the capacitor element 80, the gate line 151, the data line 171, and the common power supply line 172, which overlap with the pixel area PA.

The switching thin film transistor 10 may include a switching semiconductor layer 131, a switching gate electrode 152, a switching source electrode 173, and a switching drain electrode 174.

The driving thin film transistor 20 may include a driving semiconductor layer 132, a driving gate electrode 155, a driving source electrode 176, and a driving drain electrode 177.

The capacitor element 80 may include a first sustain electrode 158 and a second sustain electrode 178. As shown in FIG. 3, the first sustain electrode 158 and the second sustain electrode 178 may be disposed with a gate insulating layer 140 interposed therebetween.

The switching thin film transistor 10 may be used as a switching element to select a pixel to emit light. The switching gate electrode 152 may be connected to the gate line 151. The switching source electrode 173 may be connected to the data line 171. The switching drain electrode 174 may be spaced apart from the switching source electrode 173 and connected to the first sustain electrode 158.

For a selected pixel to emit light, the corresponding driving thin film transistor 20 may apply driving power to the corresponding pixel electrode 710 and may thereby enable the organic emission layer 720 of the corresponding organic light emitting element 70 to emit light. The driving gate electrode 155 may be connected to the first sustain electrode 158. The driving source electrode 176 and the second sustain electrode 178 may be connected to the common power supply line 172. The driving drain electrode 177 may be connected to the pixel electrode 710 of the organic light emitting element 70 via a contact hole 182.

By this structure, the switching thin film transistor 10 may be operated by a gate voltage applied to the gate line 151 and may serve to transfer a data voltage applied to the data line 171 to the driving thin film transistor 20. A voltage corresponding to the difference between a common voltage applied to the driving thin film transistor 20 from the common power supply line 172 and the data voltage transmitted from the switching thin film transistor 10 may be stored in the capacitor element 80, and a current corresponding to the voltage stored in the capacitor element 80 may flow to the organic light emitting element 70 through the driving thin film transistor 20 and may thereby enable the organic light emitting element 70 emit light.

Hereinafter, a structure of the organic light emitting diode display 100 will be described with reference to FIG. 3. FIG. 3 illustrates a cross-sectional view of the organic light emitting diode display 100, particularly focusing on the driving thin film transistor 20, the organic light emitting element 70, and the capacitor element 80.

Hereinafter, a structure of a thin film transistor will be described in detail with respect to the driving thin film transistor 20. As for the switching thin film transistor 10, only differences from the driving thin film transistor 20 will be briefly described.

A substrate member 110 may include, e.g., a transparent insulating substrate made of, e.g., glass, quartz, ceramic, plastic, etc. The substrate member 110 may have a transmittance that is higher than or equal to the total transmittance of various layers formed over the substrate member 110. A buffer layer 120, the driving semiconductor layer 132, a gate insulating layer 140, an interlayer insulating layer 160, a planarization layer 180, the organic emission layer 720, and various conducting wires and electrodes (see below) may be formed over the substrate member 110.

The buffer layer 120 may be formed over the substrate member 110. The buffer layer 120 may function to reduce and/or prevent penetration of impurities and to planarize a surface. The buffer layer 120 may include, e.g., various materials for carrying out this function. For example, the buffer layer 120 may include a silicon nitride (SiNx) film, a silicon oxide (SiO$_2$) film, and/or a silicon oxy-nitride film (SiOxNY). Embodiments are not limited thereto. For example, in some embodiments, the buffer layer 120 may not be employed, i.e., in some embodiments the buffer layer 120 may be omitted depending on a type and/or process conditions of the substrate member 110.

The driving semiconductor layer 132 may be formed over the buffer layer 120. The driving semiconductor layer 132 may include, e.g., a polysilicon film. The driving semiconductor layer 132 may include a channel region 135, which may be free of doped impurities, a source region 136, and a drain region 137. The source region 136 and the drain region 137 may be formed at both sides of the channel region 135 by, e.g., p+ doping. Ions to be doped may be, e.g., p-type impurities such as boron (B), mainly $B_2H_6$. The impurities employed may vary depending on the type of thin film transistor.

Although a thin film transistor of a PMOS structure using p-type impurities is used as the driving thin film transistor 20 in the exemplary embodiment described herein, embodiments are not limited thereto. In some embodiments, e.g., the driving thin film transistor 20 may be a thin film transistor having an NMOS structure, a CMOS structure, etc.

Further, it should be understood that, e.g., although the exemplary embodiment of the driving thin film transistor 20 shown in FIG. 3 is described as a polycrystalline thin film transistor including a polycrystalline silicon film, the switching thin film transistor 10 (see FIG. 2) may be a polycrystalline thin film transistor or an amorphous thin film transistor including an amorphous silicon film.

The gate insulation layer 140 may include, e.g., silicon nitride (SiNx) or silicon oxide ($SiO_2$). The gate insulation layer 140 may be formed over the driving semiconductor layer 132. Gate wiring, including, e.g., the driving gate electrode 155, may be formed over the gate insulating layer 140. More particularly, the gate wiring may include, e.g., the driving gate electrode 155, the gate line 151 (see FIG. 2), the first sustain electrode 158, etc. The driving gate electrode 155 may be formed so as to overlap with at least a part of the driving semiconductor layer 132, and, more particularly, with the channel region 135.

The interlayer insulating layer 160 may be formed on the gate insulating layer 140. The interlayer insulating layer 160 may cover the driving gate electrode 155. The gate insulating layer 140 and the interlayer insulating layer 160 may have via holes, e.g., common via holes, that expose, e.g., the source region 136 and drain region 137 of the driving semiconductor layer 132. The interlayer insulating layer 160 and/or the gate insulating layer 140 may include, e.g., silicon nitride (SiNx), silicon oxide ($SiO_2$), etc.

Data wiring, including, e.g., the driving source electrode 176 and the driving drain electrode 177, may be formed over the interlayer insulating layer 160. More particularly, the data wiring may include, e.g., the driving source electrode 176, the data line 171 (see FIG. 2), the common power supply line 172, the second sustain electrode 178, etc. The driving source electrode 176 and the driving drain electrode 177 may be respectively connected, via respective via holes, to the source region 136 and the drain region 137 of the driving semiconductor layer 132.

In some embodiments, the driving thin film transistor 20 including the driving semiconductor layer 132, the driving gate electrode 155, the driving source electrode 176, and the driving drain electrode 177 may be formed in the exemplary manner described above. The configuration of the driving thin film transistor 20 is not, however, limited to the aforementioned example, and may be modified in a variety of well-known configurations that can be easily implemented by those skilled in the art.

The planarization layer 180 may be formed on the interlayer insulating layer 160, and may cover the data wiring, e.g., the common power supply line 172, the driving source electrode 176, the driving drain electrode 177 and/or the second sustain electrode 178. The planarization layer 180 may function to cover stepped portions and to planarize a surface in order to improve the light emission efficiency of the organic light emitting element 70. The planarization layer 180 may include the contact hole 182 exposing part of the driving drain electrode 177.

The planarization layer 180 may include, e.g., one or more of polyacrylate resin, epoxy resin, phenolic resin, polyamide resin, polyimide resin, unsaturated polyester resin, poly(phenylene ether) resin, poly(phenylene sulfide) resin, and/or benzocyclobutene (BCB).

The pixel electrode 710 of the organic light emitting element 70 may be formed over the planarization layer 180. The pixel electrode 710 may be connected to the driving drain electrode 177 via the contact hole 182 of the planarization layer 180.

In the pixel area PA, the driving gate electrode 155, the driving source electrode 176, the driving drain electrode 177, the first sustain electrode 158, the second sustain electrode 178, the gate line 151 (see FIG. 2), and the common power line 172 may all be disposed under the pixel electrode 710, e.g., between the pixel electrode 710 and the substrate member 110.

A pixel definition layer 190 may be formed on the planarization layer 180. The pixel definition layer 190 may include an opening to expose the pixel electrode 710. That is, the pixel electrode 710 may be disposed corresponding to the opening of the pixel definition layer 190. In some embodiments, the portion where the pixel definition layer 190 is formed may be similar to portions other than the portion where the pixel electrode 710 is formed. That is, e.g., the area where the pixel definition layer 190 is formed may be similar to and/or correspond to the transparent area TA. The pixel definition layer 190 may include, e.g., a resin, such as polyacrylate resin and polyimide resin, or a silica-based inorganic material.

The organic emission layer 720 may be formed over the pixel electrode 710. The common electrode 730 may be formed on the organic emission layer 720. In some embodiments, the organic light emitting element 70, including the pixel electrode 710, the organic emission layer 720, and the common electrode 730 may be formed in the exemplary manner described above.

The organic emission layer 720 may include, e.g., a low molecular organic material or a high molecular organic material. The organic emission layer 720 may include a plurality of layers. For example, the organic emission layer 720 may include a hole injection layer (HIL), a hole transport layer (HTL), an emission layer, an electron transport layer (ETL), and an electron injection layer (EIL). In such embodiments, the hole injection layer (HIL) may be disposed on the pixel electrode 710, which is a positive electrode, and the hole transport layer (HTL), the emission layer, the electron transport layer (ETL), and the electron injection layer (EIL) may be sequentially stacked on the hole injection layer (HIL).

In some embodiments, the organic light emitting diode display 100 may be a front emission type. In such embodiments, the organic emission layer 720 may emit light in a direction of the common electrode 730 to display an image.

The pixel electrode 710 may include a reflective conducting material. The reflective conducting material may include, e.g., lithium (Li), calcium (Ca), lithium fluoride/calcium (LiF/Ca), lithium fluoride/aluminum (LiF/Al), aluminum (Al), silver (Ag), magnesium (Mg), and/or gold (Au). Embodiments are not, however, limited thereto. For example, the pixel electrode 710 may include a plurality of layers including a transparent conductive layer and a reflective layer.

The common electrode 730 may include, e.g., a transparent conducting material or a semi-transparent conducting material. The transparent conducting material may include, e.g., indium tin oxide (ITO), indium zinc oxide (IZO), zinc oxide (ZnO), and/or indium oxide (In2O3). The semi-transparent conducting material may include, e.g., a co-deposition material including at least one of magnesium (Mg) and silver (Ag), or may be one or more materials from among magnesium (Mg), silver (Ag), calcium (Ca), lithium (Li), and/or aluminum (Al).

The buffer layer 120, the gate insulating layer 140, the interlayer insulating layer 160, the planarization layer 180, and the pixel definition layer 190 may be formed to be transparent. In embodiments, other than respective portions of the gate line 151, the data line 171, and the common power supply line 172, only transparent components, e.g., the buffer layer 120, the gate insulating layer 140, the interlayer insulating layer 160, the planarization layer 180, and the pixel definition layer 190, may be disposed in the transparent area TA. Further, as discussed above, in embodiments, the gate line 151, the data line 171, and the common power supply line 172 may be arranged to minimally overlap the transparent area TA.

As illustrated above in FIG. 1, the pixel areas PA and the transparent area TA may be formed such that an area ratio of the transparent area TA to the total area of the pixel areas PA and the transparent area TA is equal to and/or within a range of about 20% to about 90%.

Embodiments of an organic light emitting diode display, e.g., the organic light emitting display 100 of FIG. 1, may suppress scattering of transmitted light, and may thereby achieve transparency resulting from the reduction and/or prevention of distortion as compared to comparable conventional displays.

Embodiments including one or more features described above may enable a user to see an object or image located at an opposite side through a organic light emitting diode display, e.g., display 100 described above, with reduced and/or no distortion when the organic light emitting diode display 100 is in an off state, and may see an image emitted from the organic light emitting element when the organic light emitting diode display, e.g., display 100 described above, is in an on state.

If an area ratio of the transparent area TA to a total area of the pixel areas PA and the transparent area TA is less than 20%, an amount of light that is capable of being transmitted through the organic light emitting diode display 100 is small. Thus, it may be difficult for an user to see an object or image located at an opposite side of an organic light emitting diode display, such that the organic light emitting diode display may not be characterized as transparent.

On the other hand, if the area ratio of the transparent area TA to the total area of the pixel areas PA and the transparent area TA is greater than 90%, a degree of pixel integration of the organic light emitting diode display 100 may be too low to realize a stable image through light emission of the organic light emitting element 70. That is, the smaller the area of the pixel areas PA, it may be necessary to increase the luminance of light emitted from an organic light emitting element, e.g., the organic light emitting element 70, in order to compensate for the reduced pixel area PA, i.e., pixel area PA may be inversely proportional to luminance of light emitting elements of the pixels. However, when an organic light emitting element, e.g., the organic light emitting element 70, is operated in a high luminance state, the lifespan thereof is sharply shortened. Also, if the area ratio of the transparent area TA is increased to higher than 90% while maintaining each pixel area PA at a proper size, the number of pixel areas PA is reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display including a transparent area and a plurality of pixel areas, the pixel areas being spaced apart from each other and the transparent area being interposed between the pixel areas, the display comprising:
a substrate member;
pixel electrodes on the substrate member, the pixel electrodes corresponding to the pixel areas of the display;
thin film transistors and capacitor elements completely arranged on the pixel electrodes; and
a gate line, a data line, and a common power supply connected to corresponding ones of the thin film transistors and/or the capacitor elements, each of the gate line, the data line, and the common power supply line including pixel portions directly overlapping with corresponding ones of the pixel electrodes and interconnecting portions extending between neighboring ones of the pixel electrodes so as to connect neighboring ones of the pixel portions of the gate line, the data line, and the common power supply line, respectively, wherein only the interconnecting portions of the gate line, the data line, and the common power supply line are arranged on the transparent area of the display.

2. The display as claimed in claim 1, wherein the substrate member includes glass, quartz, ceramic and/or plastic.

3. The display as claimed in claim 1, wherein the substrate member has a transmittance that is higher than or equal to a total transmittance of all layers and/or elements arranged thereon, the layers and/or elements including a buffer layer, an insulating layer, an interlayer insulation layer, and a planarization layer arranged on the substrate member.

4. The display device as claimed in claim 1, wherein other than the interconnecting portions of the gate line, the data line, and the common power supply line, only transparent layers and/or elements are arranged on portions of the substrate member overlapping with the transparent area of the display.

5. The display device as claimed in claim 1, further comprising:
a buffer layer on the substrate member;
a gate insulating layer on the buffer layer;
a planarization layer on the gate insulating layer; and
a pixel definition layer on the gate insulating layer, wherein the buffer layer, the gate insulating layer, the planarization layer and the pixel definition layer include only transparent materials.

6. The display device as claimed in claim 5, wherein the pixel definition layer is arranged on portions of the substrate member corresponding to the transparent area of the display.

7. The display device as claimed in claim 1, wherein the pixel electrodes are arranged in a matrix pattern including rows extending along a first direction and columns extending along a second direction, the first direction crossing the second direction.

8. The display device as claimed in 7, wherein the gate line extends along the first direction and the interconnecting portions of the gate line extend between facing sides of neighboring ones of the pixel electrodes arranged in one of the rows.

9. The display device as claimed in claim 7, wherein the data line and the common power supply line extend along the second direction and the interconnecting portions of the of the data line and the common power supply line extend between facing sides of neighboring ones of the pixel electrodes arranged in one of the columns.

10. The display device as claimed in claim 1, wherein the pixel areas of the display correspond to areas of the pixel electrodes.

11. The display device as claimed in claim 10, wherein within a display area of the display, the transparent area corresponds to an area of the display region other than the pixel areas.

12. An organic light emitting diode display including a transparent area and a plurality of pixel areas, the pixel areas being spaced apart from each other and the transparent area being interposed between the pixel areas, the display comprising:
- a substrate member;
- thin film transistors and capacitor elements on the substrate member, the thin film transistor and the capacitor elements overlapping with the pixel areas;
- a gate line, a data line, and a common power supply line on the substrate member, the gate line, the data line, and the common power supply line overlapping with the pixel areas and the transparent area, and being connected to corresponding ones of the thin film transistors and/or the capacitor elements; and
- pixel electrodes on the substrate member, the pixel electrodes overlapping with all of the thin film transistors and capacitor elements, and with respective portions of the gate line, the data line, and the common power supply line that overlap with the pixel areas.

13. The organic light emitting diode display as claimed in claim 12, wherein
the pixel area is substantially and/or completely a same as a region covered by the pixel electrode.

14. The organic light emitting diode display as claimed in claim 13, wherein an area ratio of the transparent area to a total area of the pixel areas and the transparent area is equal to or within the range of about 20% to about 90%.

15. The organic light emitting diode display as claimed in claim 14, wherein the area ratio of the transparent area to the total area of the pixel areas and the transparent area is within a range of 20% to 90%.

16. The organic light emitting diode display as claimed in claim 13, wherein the pixel electrode includes a reflective conducting material.

17. The organic light emitting diode display as claimed in claim 12, further comprising:
- an organic emission layer and a common electrode that are sequentially formed on the pixel electrode,
- wherein the organic emission layer is adapted to emit light in a direction of the common electrode to display an image.

18. The organic light emitting diode display as claimed in claim 12, wherein the gate line, the data line, and the common power supply line on neighboring ones of the pixels areas are interconnected over the transparent area.

19. The organic light emitting diode display as claimed in claim 12, further comprising:
- an insulating layer, a planarization layer, and a pixel definition layer on the substrate member,
- wherein the planarization layer and the pixel definition layer include a transparent material.

20. The organic light emitting diode display as claimed in claim 12, wherein a transmittance of the substrate member is higher than and/or equal to a total transmittance of layers formed on the substrate member.

* * * * *